United States Patent
Harada

(10) Patent No.: US 9,460,896 B2
(45) Date of Patent: Oct. 4, 2016

(54) PLASMA PROCESSING METHOD AND PLASMA PROCESSING APPARATUS

(71) Applicant: Tokyo Electron Limited, Tokyo (JP)

(72) Inventor: Akitoshi Harada, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/424,217

(22) PCT Filed: Aug. 7, 2013

(86) PCT No.: PCT/JP2013/071409
§ 371 (c)(1),
(2) Date: Feb. 26, 2015

(87) PCT Pub. No.: WO2014/034396
PCT Pub. Date: Mar. 6, 2014

(65) Prior Publication Data
US 2015/0228458 A1    Aug. 13, 2015

Related U.S. Application Data

(60) Provisional application No. 61/695,630, filed on Aug. 31, 2012.

(30) Foreign Application Priority Data

Aug. 27, 2012  (JP) .................................. 201-186344

(51) Int. Cl.
*H01J 37/32*  (2006.01)
*H01L 21/311*  (2006.01)
(Continued)

(52) U.S. Cl.
CPC ............. *H01J 37/3244* (2013.01); *C23F 4/00* (2013.01); *H01J 37/32091* (2013.01);
(Continued)

(58) Field of Classification Search
None
See application file for complete search history.

(56) References Cited

U.S. PATENT DOCUMENTS 5,948,702 A * 9/1999 Rotondaro ............... C23G 5/00
257/E21.253
6,692,903 B2 * 2/2004 Chen ....................... G03F 7/427
134/1.1
(Continued)

FOREIGN PATENT DOCUMENTS

JP  03-239323 A  10/1991
JP  09-171999 A   6/1997
(Continued)

OTHER PUBLICATIONS

International Search Report for PCT/JP2013/071409 dated Oct. 29, 2013.

*Primary Examiner* — Anita Alanko
(74) *Attorney, Agent, or Firm* — Pearne & Gordon LLP

(57) ABSTRACT

A plasma processing method performs an etching process (S101) of supplying a first fluorine-containing gas into a plasma processing space and etching a target substrate with plasma of the first fluorine-containing gas. Then, the plasma processing method performs a carbon-containing material removal process (S102) of supplying an $O_2$ gas into the plasma processing space and removing, with plasma of the $O_2$ gas, a carbon-containing material deposited on a member, of which a surface is arranged to face the plasma processing space, after the etching process. Thereafter, the plasma processing method performs a titanium-containing material removal process (S103) of supplying a nitrogen-containing gas and a second fluorine-containing gas into the plasma processing space and removing, with plasma of the nitrogen-containing gas and the second fluorine-containing gas, the titanium-containing material deposited on the member after the etching process.

11 Claims, 10 Drawing Sheets

(51) Int. Cl.
  *H01L 21/32* (2006.01)
  *C23F 4/00* (2006.01)
(52) U.S. Cl.
  CPC .. *H01J 37/32165* (2013.01); *H01J 37/32449* (2013.01); *H01J 37/32458* (2013.01); *H01J 37/32862* (2013.01); *H01L 21/31116* (2013.01); *H01L 21/31144* (2013.01); *H01J 2237/334* (2013.01)

(56) References Cited

U.S. PATENT DOCUMENTS

| | | |
|---|---|---|
| 2006/0118520 A1 | 6/2006 | Morikita |
| 2006/0191555 A1* | 8/2006 | Yoshida ................ B08B 7/0035 134/1.1 |
| 2008/0194114 A1 | 8/2008 | Yoshida |
| 2009/0093104 A1* | 4/2009 | Arita .................... H01L 21/3065 438/462 |
| 2012/0085366 A1* | 4/2012 | Hirota ............... H01J 37/32192 134/1.1 |
| 2012/0094499 A1* | 4/2012 | Ng .................... H01J 37/32862 438/710 |
| 2014/0373867 A1* | 12/2014 | Harada ............. H01J 37/32862 134/1.1 |

FOREIGN PATENT DOCUMENTS

| | | |
|---|---|---|
| JP | 10-280151 A | 10/1998 |
| JP | 2006-035213 A | 2/2006 |
| JP | 2006-165246 A | 6/2006 |
| JP | 2006-216964 A | 8/2006 |
| JP | 2012-084600 A | 4/2012 |

* cited by examiner

PLASMA PROCESSING METHOD AND PLASMA PROCESSING APPARATUS

CROSS-REFERENCE TO RELATED APPLICATION

This Application is a U.S. national phase application under 35 U.S.C. §371 of PCT Application No. PCT/JP2013/071409 filed on Aug. 7, 2013, which claims the benefit of Japanese Patent Application No. 2012-186344 filed on Aug. 27, 2012, and U.S. Provisional Application Ser. No. 61/695,630 filed on Aug. 31, 2012, the entire disclosures of which are incorporated herein by reference.

TECHNICAL FIELD

The embodiments described herein pertain generally to a plasma processing method and a plasma processing apparatus.

BACKGROUND

In a semiconductor manufacturing process, a plasma processing apparatus that performs a plasma process of etching or depositing a thin film has been widely used. Examples of the plasma processing apparatus may include a plasma CVD (Chemical Vapor Deposition) apparatus that performs a deposition process of a thin film or a plasma etching apparatus that performs an etching process.

The plasma processing apparatus includes, for example, a processing vessel that partitions a plasma processing space; a sample table that mounts a target substrate thereon within the processing vessel; and a gas supply system that supplies a processing gas for plasma reaction into the processing vessel. Further, the plasma processing apparatus also includes a plasma generation device that supplies electromagnetic energy such as a microwave, a RF wave, etc. to excite the processing gas within the processing vessel into plasma; and a bias voltage application device that applies a bias voltage to the sample table to accelerate ions in the plasma toward the target substrate mounted on the sample table.

It has been known that in a plasma processing apparatus, when etching a target substrate on which an insulating film for dual damascene wiring is formed, a mask film having plasma resistance is formed on a surface of the insulating film to form an etching pattern on the insulating film. In this regard, for example, Patent Document 1 describes that a mask film of a titanium-containing material (e.g., TiN) is formed on a surface of an insulating film on a target substrate, and the mask film is arranged within a processing vessel to face a plasma processing space and then the target substrate is etched using the mask film as a mask.

Patent Document 1: Japanese Patent Laid-open Publication No. 2006-216964

DISCLOSURE OF THE INVENTION

Problems to be Solved by the Invention

However, in the conventional technology, there has been a risk of degrading etching characteristics of the target substrate with a lapse of time. That is, in the convention technology, when the target substrate is etched with the TiN mask film as a mask, the insulating film at an opening of the etching pattern and the mask film itself are etched. For this reason, in the conventional technology, deposits such as a titanium-containing material generated from the etched mask film are accumulatively deposited on various components facing the plasma processing space, so that plasma density within the plasma processing space is varied. As a result, the etching characteristics of the target substrate may be degraded with a lapse of time. Particularly, when multiple lots of target substrates are processed, such degradation of the etching characteristics becomes remarkable.

Means for Solving the Problems

In one example embodiment, a plasma processing method is performed in a plasma processing apparatus, and the plasma processing method includes a first process, a second process and a third process. In the first process, a first fluorine-containing gas is supplied into a plasma processing space and a target substrate, in which an insulating film is formed and a mask film of a titanium-containing material is formed on a surface of the insulating film, is etched with plasma of the first fluorine-containing gas. In the second process an $O_2$ gas is supplied into the plasma processing space and, a carbon-containing material deposited on a member, of which a surface is arranged to face the plasma processing space, after the first process, is removed with plasma of the $O_2$ gas. In the third process, a nitrogen-containing gas and a second fluorine-containing gas are supplied into the plasma processing space, the titanium-containing material deposited on the member after the first process, is removed with plasma of the nitrogen-containing gas and the second fluorine-containing gas.

Effect of the Invention

In accordance with the example embodiments, it is possible to provide a plasma processing method and a plasma processing apparatus capable of suppressing the etching characteristics of the target substrate from being degraded with a lapse of time.

MODE FOR CARRYING OUT THE INVENTION

Figure 1:
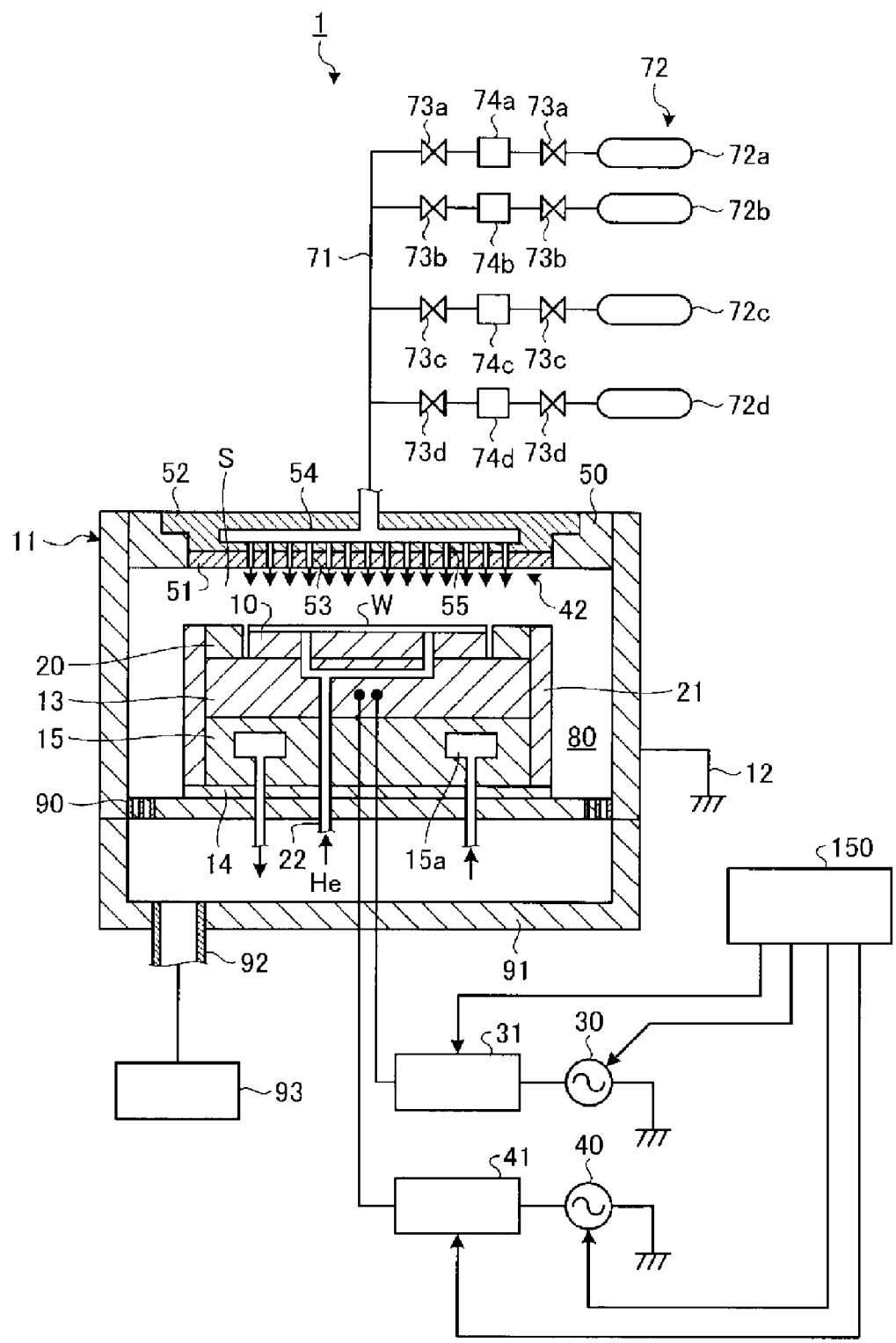
FIG. 1 is a longitudinal cross-sectional view illustrating a schematic configuration of a plasma processing apparatus in accordance with an example embodiment.

Hereinafter, various example embodiments will be explained in detail with reference to the accompanying drawings. Further, in the drawings, the same or corresponding components will be respectively assigned the same reference numerals.

In one example embodiment, a plasma processing method performed in a plasma processing apparatus includes a first process of supplying a first fluorine-containing gas into a plasma processing space and etching a target substrate, in which an insulating film is formed and a mask film of a titanium-containing material is formed on a surface of the insulating film, with plasma of the first fluorine-containing gas; a second process of supplying an $O_2$ gas into the plasma processing space and removing, with plasma of the $O_2$ gas, a carbon-containing material deposited on a member, of which a surface is arranged to face the plasma processing space, after the first process; and a third process of supplying a nitrogen-containing gas and a second fluorine-containing gas into the plasma processing space and removing, with plasma of the nitrogen-containing gas and the second fluorine-containing gas, the titanium-containing material deposited on the member after the first process.

The plasma processing method may further include a fourth process of supplying a third fluorine-containing gas into the plasma processing space and removing, with plasma of the third fluorine-containing gas, the titanium-containing material deposited on the member after the first process. Here, the fourth process may be performed between the second process and the third process.

The plasma processing apparatus may be configured to perform the second process and the third process repeatedly at least twice after performing the first process.

The nitrogen-containing gas may be at least one of a $N_2$ gas and a $NF_3$ gas, and the second fluorine-containing gas may be a at least one of a CF as a $C_4F_8$ gas, and a $CHF_3$ gas.

In another example embodiment, a plasma processing apparatus includes a processing vessel configured to partition a plasma processing space accommodating therein a target substrate, in which an insulating film is formed and a mask film of a titanium-containing material is formed on a surface of the insulating film; a first gas supply unit configured to supply a first fluorine-containing gas into the plasma processing space; a second gas supply unit configured to supply an $O_2$ gas into the plasma processing space; a third gas supply unit configured to supply a nitrogen-containing gas and a second fluorine-containing gas into the plasma processing space; and a control unit configured to perform a first process of supplying the first fluorine-containing gas supplied from the first gas supply unit into the plasma processing space and etching the target substrate with plasma of the first fluorine-containing gas, a second process of supplying the $O_2$ gas supplied from the second gas supply unit into the plasma processing space and removing, with plasma of the $O_2$ gas, a carbon-containing material deposited on a member, of which a surface is arranged to face the plasma processing space, after the first process, and a third process of supplying the nitrogen-containing gas and the second fluorine-containing gas supplied from the third gas supply unit into the plasma processing space and removing, with plasma of the nitrogen-containing gas and the second fluorine-containing gas, the titanium-containing material deposited on the member after the first process.

FIG. 1 is a longitudinal cross-sectional view illustrating a schematic configuration of a plasma processing apparatus in accordance with an example embodiment. As depicted in FIG. 1, a plasma processing apparatus 1 includes a substantially cylindrical processing vessel 11 having therein a plasma processing space S in which a plasma process is performed. The processing vessel 11 is electrically grounded via a ground line 12. Further, a surface of the processing vessel 11 faces the plasma processing space S. That is, the processing vessel 11 is provided such that the surface thereof faces the plasma processing space S.

Within the processing vessel 11, a wafer chuck 10 configured to hold a wafer W as a target substrate is provided. The wafer W held on the wafer chuck 10 is arranged such that a mask film D2 of the wafer W to be described later faces the plasma processing space S. A bottom surface of the wafer chuck 10 is supported on a susceptor 13 serving as a lower electrode. The susceptor 13 is made of a metal such as aluminum and has a substantially disk shape. A supporting table 15 is provided at a bottom of the processing vessel 11 via an insulating plate 14, and the susceptor 13 is supported on a top surface of the supporting table 15. An electrode (not illustrated) is embedded in the wafer chuck 10, and the wafer chuck 10 is configured to attract and hold the wafer W by an electrostatic force generated by applying a DC voltage to the electrode.

A conductive focus ring 20 made of, for example, silicon is provided on an outer peripheral portion of the wafer chuck 10 as a top surface of the susceptor 13 in order to improve uniformity of a plasma process. Outer side surfaces of the susceptor 13, the supporting table 15, and the focus ring 20 are covered with a cylindrical member 21 made of, for example, quartz. Further, a surface of the focus ring 20 faces the plasma processing space S. That is, the focus ring 20 is provided such that the surface thereof faces the plasma processing space S.

Within the supporting table 15, a coolant path 15a configured to allow a coolant to flow therein is formed into, for example, a circular ring shape. By adjusting a temperature of the coolant supplied into the coolant path 15a, a temperature of the wafer W held on the wafer chuck 10 can be controlled. Further, a heat transfer gas line 22 configured to supply a heat transfer gas, e.g., a helium gas into a gap between the wafer chuck 10 and the wafer W held on the wafer chuck 10 is provided to pass through, for example, the susceptor 13, the supporting table 15, and the insulating plate 14.

The susceptor 13 is electrically connected to a first high frequency power supply 30 configured to apply a high frequency power for plasma generation to the susceptor 13 via a first matching device 31. The first high supply power supply 30 is configured to output a high frequency power having a frequency of, for example, from 27 MHz to 100 MHz, e.g., 40 MHz in the present example embodiment. The first matching device 31 is configured to match internal impedance of the first high frequency power supply 30 with load impedance, and to allow the internal impedance of the first high frequency power supply 30 and the load impedance to be apparently matched with each other when plasma is generated within the processing vessel 11.

Further, the susceptor 13 is also electrically connected to a second high frequency power supply 40 configured to apply a bias voltage for ion attraction into the wafer W by applying a high frequency power to the susceptor 13 via a second matching device 41. The second high frequency power supply 40 is configured to output a high frequency power having a frequency of, for example, from 400 kHz to 13.56 MHz, e.g., 13.56 MHz in the present example embodiment. The frequency of the high frequency power outputted from the second high frequency power supply 40 is lower than the frequency of the high frequency power outputted from the first high frequency power supply 30. Like the first matching device 31, the second matching device 41 is also configured to match internal impedance of the second high frequency power supply 40 with load impedance. Further, in the following description, the high frequency power outputted from the first high frequency power supply 30 and the high frequency power outputted from the second high frequency power supply 40 may be referred to as a "high frequency power HF" and a "high frequency power LF", respectively.

The first high frequency power supply 30, the first matching device 31, the second high frequency power supply 40, and the second matching device 41 are connected to a control unit 150 to be descried later, and the overall operations thereof are controlled by the control unit 150.

Above the susceptor 13 as the lower electrode, an upper electrode 42 is provided to face the susceptor 13 in parallel. The upper electrode 42 is supported on a ceiling portion of the processing vessel 11 via a conductive supporting member 50. Accordingly, the upper electrode 42 is also electrically grounded like the processing vessel 11.

The upper electrode 42 includes an electrode plate 51 that forms a surface of the upper electrode 42 facing the wafer W held on the wafer chuck 10; and an electrode supporting body 52 that supports the electrode plate 51 from above. Multiple gas discharge holes 53 configured to supply a processing gas into the processing vessel 11 are formed through the electrode plate 51. The electrode plate 51 is made of, for example, a semiconductor or a conductor having low Joule heat and low resistance, and in the present example embodiment, for example, silicon is used. Further, a surface of the electrode plate 51 facing the wafer W faces the plasma processing space S. That is, the electrode plate 51 is provided such that the surface thereof faces the plasma processing space S.

The electrode supporting body 52 is made of a conductor, and in the present example embodiment, for example, aluminum is used. A gas diffusion space 54 having a substantially disk shape is formed in a central portion within the electrode supporting body 52. Multiple gas through holes 55 extended downwards from the gas diffusion space 54 are formed in a lower portion of the electrode supporting body 52, and the gas discharge holes 53 communicate with the gas diffusion space 54 via the gas through holes 55.

The gas diffusion space 54 is connected to a gas supply line 71. The gas supply line 71 is connected to a processing gas supply source 72 as illustrated in FIG. 1, and the processing gas supplied from the processing gas supply source 72 is introduced into the gas diffusion space 54 via the gas supply line 71. The processing gas introduced into the gas diffusion space 54 is then discharged into the processing vessel 11 through the gas through holes 55 and the gas discharge holes 53. That is, the upper electrode 42 serves as a shower head configured to supply the processing gas into the processing vessel 11.

In the present example embodiment, the processing gas supply source 72 includes a gas supply unit 72a, a gas supply unit 72b, a gas supply unit 72c, and a gas supply unit 72d. The gas supply unit 72a is configured to supply a first fluorine-containing gas as an etching gas into the plasma processing space S. The first fluorine-containing gas is, for example, a $C_4F_8$ gas. The gas supply unit 72a is an example of the first gas supply unit configured to supply the first fluorine-containing gas into the plasma processing space S.

The gas supply unit 72b is configured to supply an $O_2$ gas as a removing gas of deposit generated after an etching process into the plasma processing space S. The gas supply unit 72b is an example of the second gas supply unit configured to supply the $O_2$ gas into the plasma processing space S.

The gas supply unit 72c is configured to supply a nitrogen-containing gas as a removing gas of deposit generated after the etching process into the plasma processing space S. The nitrogen-containing gas is, for example, at least one of a $N_2$ gas and a $NF_3$ gas. Further, the gas supply unit 72d is configured to supply a second fluorine-containing gas as a removing gas of deposit generated after the etching process into the plasma processing space S. The second fluorine-containing gas is, for example, at least one of a $CF_4$ gas, a $C_4F_8$ gas, and a $CHF_3$ gas. The gas supply unit 72c and the gas supply unit 72d are examples of the third gas supply unit configured to supply the nitrogen-containing gas and the second fluorine-containing gas into the plasma processing space S.

Further, the gas supply unit 72d may supply a third fluorine-containing gas as a removing gas of deposit generated after the etching process into the plasma processing space S. The third fluorine-containing gas is a gas containing C, H, and F, for example, a $CHF_3$ gas.

Furthermore, the processing gas supply source 72 includes valves 73a, 73b, 73c, and 73d and flow rate controllers 74a, 74b, 74c, and 74d respectively provided between the gas supply units 72a, 72b, 72c, and 72d and the gas diffusion space 54. The flow rates of the gases supplied into the gas diffusion space 54 are controlled by the flow rate controllers 74a, 74b, 74c, and 74d.

A gas exhaust path 80 serving as a flow path through which an atmosphere within the processing vessel 11 is exhausted to the outside of the processing vessel 11 is formed between an inner wall of the processing vessel 11 and an outer side surface of the cylindrical member 21 at a bottom portion of the processing vessel 11. A gas exhaust opening 90 is formed at a bottom surface of the processing vessel 11. A gas exhaust chamber 91 is provided under the gas exhaust opening 90, and a gas exhaust device 93 is connected to the gas exhaust chamber 91 via a gas exhaust line 92. By operating the gas exhaust device 93, the atmosphere within the processing vessel 11 is exhausted through the gas exhaust path 80 and the gas exhaust opening 90, and, thus, the inside of the processing vessel 11 can be depressurized to a preset vacuum level.

Further, the control unit 150 is provided in the plasma processing apparatus 1. The control unit 150 is, for example, a computer including a program storage unit (not illustrated) as a storage device, for example, a memory. The program storage unit also stores a program for operating the plasma processing apparatus 1 by controlling the respective power supplies 30 and 40 or the respective matching devices 31 and 41 and the flow rate controller 74. By way of example, the control unit 150 controls a process of supplying the first fluorine-containing gas from the gas supply unit 72a into the plasma processing space S and etching the wafer W with plasma of the first fluorine-containing gas. Further, for example, the control unit 150 controls a process of supplying an $O_2$ gas from the gas supply unit 72b into the plasma processing space S and removing, with plasma of the $O_2$ gas, a carbon-containing material deposited on members (for example, the processing vessel 11, the electrode plate 51, and the focus ring 20), of which surfaces are arranged to face the plasma processing space S, after performing the etching process on the wafer W. Furthermore, for example, the control unit 150 controls a process of supplying the nitrogen-containing gas and the second fluorine-containing gas from the gas supply unit 72c and the gas supply unit 72d, respectively, into the plasma processing space S and removing, with plasma of the nitrogen-containing gas and the second fluorine-containing gas, a titanium-containing material deposited on the members, of which the surfaces are arranged to face the plasma processing space S, after performing the etching process on the wafer W.

Further, the program is stored in a computer readable storage medium such as a hard disk (HD), a flexible disk (FD), a compact disk (CD), a magneto-optical disk (MO), a memory card or the like and may be installed in the control unit 150 from the computer readable storage medium.

Figure 2A:
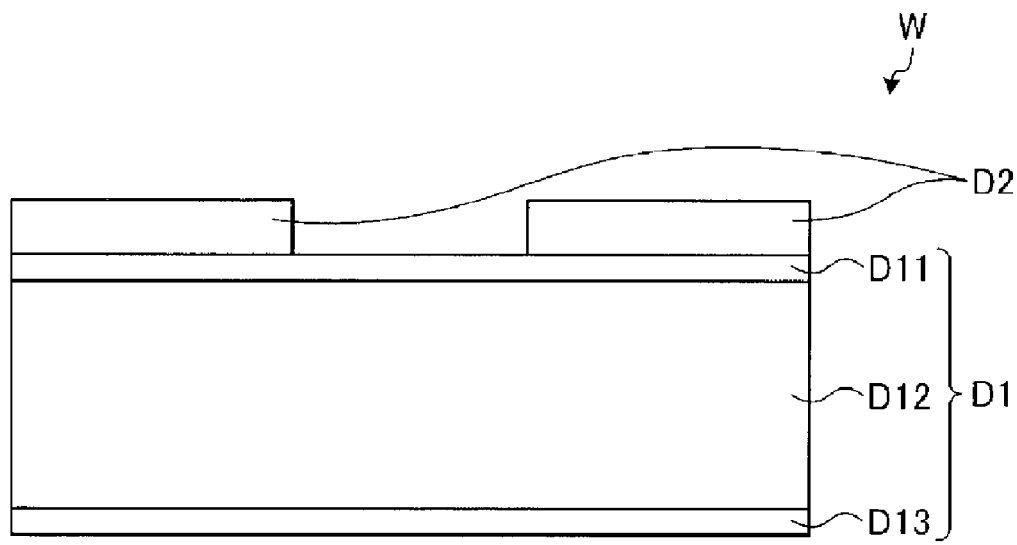
FIG. 2A is a diagram illustrating a configuration example of a pre-etched wafer in the plasma processing apparatus in accordance with the example embodiment.
Figure 2B:
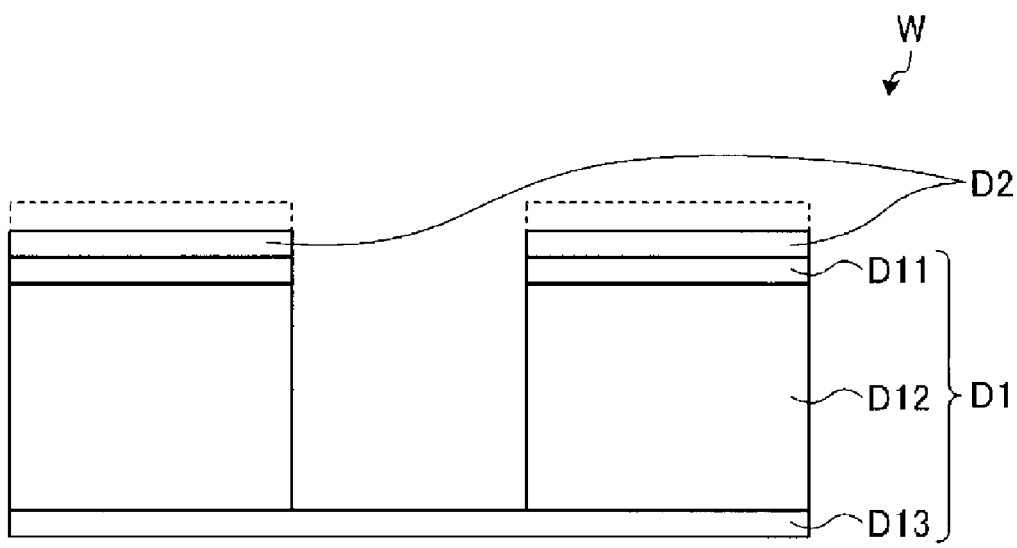
FIG. 2B is a diagram illustrating a configuration example of a post-etched wafer in the plasma processing apparatus in accordance with the example embodiment.

Hereinafter, an example of the wafer W to be etched in the plasma processing apparatus 1 will be explained. FIG. 2A is a diagram illustrating the example of a pre-etched wafer in the plasma processing apparatus in accordance with the example embodiment. FIG. 2B is a diagram illustrating an example of the post-etched wafer in the plasma processing apparatus in accordance with the example embodiment. As depicted in FIG. 2A, the wafer W includes an insulating film D1 and a mask film D2 formed on a surface of the insulating film D1. The insulating film D1 is an interlayer insulating film for dual damascene wiring, and includes a first insulating film D11, a second insulating film D12, and a third insulating film D13. The first insulating film D11 is formed of, for example, SiON. The second insulating film D12 is formed of a material having a relative permittivity of a preset value (for example, 4.2) or less. The second insulating film D12 is formed of, for example, SiOCH. The third insulating film D13 is formed of, for example, SiCN.

The mask film D2, on which an etching pattern having a preset opening is formed, is formed of a titanium-containing material having plasma resistance. The mask film D2 is formed of, for example, TiN. The wafer W, on which the mask film D2 of a titanium-containing material is formed on a surface of the insulating film D1, is arranged such that the mask film D2 faces the plasma processing space S.

As described above, in the plasma processing apparatus 1, the wafer W, on which the mask film D2 of the titanium-containing material (e.g., TiN, or the like) is formed on the surface of the insulating film D1, is arranged such that the mask film D2 faces the plasma processing space S. In the plasma processing apparatus 1, when the wafer W is etched with the mask film D2 of TiN (hereinafter, appropriately referred to as "TiN film") as a mask, the opening (the opening of the mask film D2) of the etching pattern is exposed to plasma, and for example, as depicted in FIG. 2B, the insulating film D1 (the first insulating film D11 and the second insulating film D12) is etched. At this time, as well as the insulating film D1, the TiN film itself may be etched as indicated by a dashed line in FIG. 2B. If the TiN film itself is etched, a carbon-containing material generated from the insulating film D1 and a titanium-containing material generated from the TiN film are deposited on the members (for example, the processing vessel 11, the electrode plate 51, and the focus ring 20), of which the surfaces are arranged to face the plasma processing space S. If the titanium-containing material is accumulatively deposited on the members of which the surfaces are arranged to face the plasma processing space S, plasma density within the plasma processing space S may not be uniform. As a result, the etching characteristics of the wafer W may be degraded with a lapse of time.

In view of the foregoing, the present inventor has repeated a close study on a method of removing a titanium-containing material deposited on the member, of which the surface is arranged to face the plasma processing space S, after performing the etching process on the wafer W with high efficiency. As a result, the present inventor has found out that it is possible to remove a titanium-containing material with high efficiency by removing a carbon-containing material with plasma of an $O_2$ gas and a titanium-containing material with plasma of a nitrogen-containing gas and a fluorine-containing gas. Hereinafter, the reason for the above will be explained. Further, in the following descriptions, as an example of a member of which a surface is arranged to face the plasma processing space S, the electrode plate 51 of the upper electrode 42 will be used, but it is not limited thereto. In the present example embodiment, the member of which a surface is arranged to face the plasma processing space S can also be applied to the other members such as the processing vessel 11 and the focus ring 20.

Figure 3A:
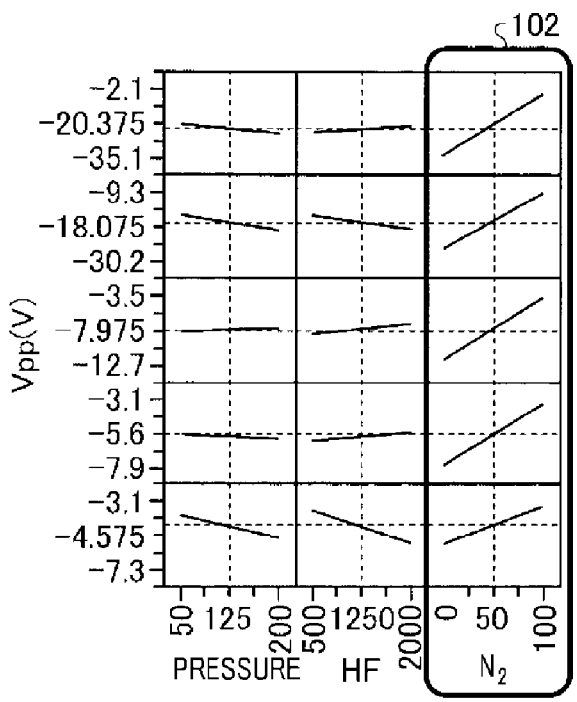
FIG. 3A is a diagram illustrating a result of experiments for selecting a factor contributing to removal of a titanium-containing material.
Figure 3B:
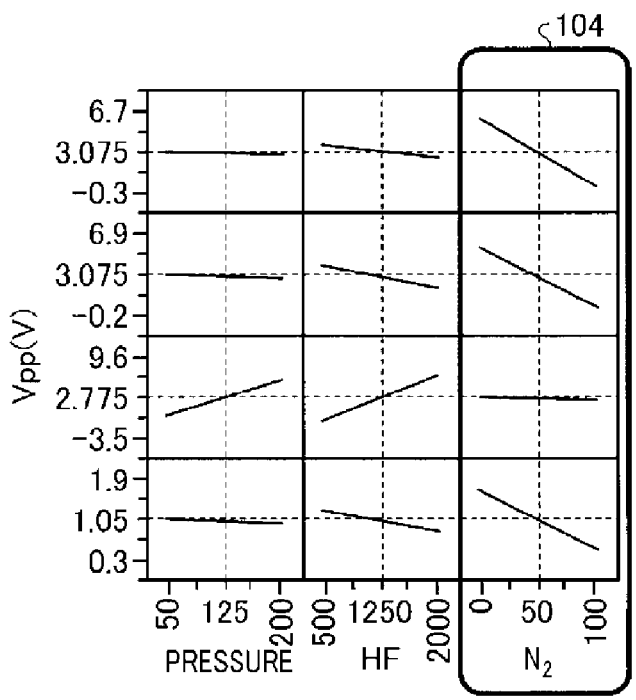
FIG. 3B is a diagram illustrating a result of experiments for selecting a factor contributing to the removal of the titanium-containing material.
Figure 3C:
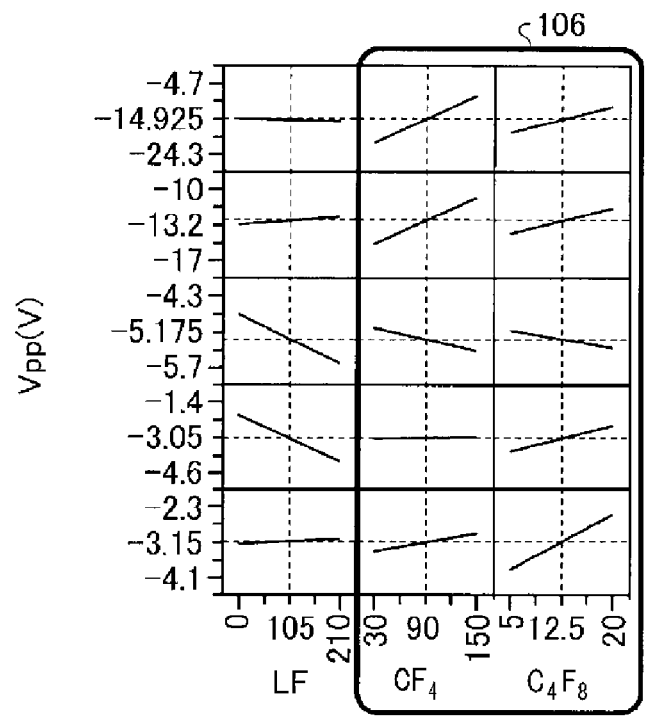
FIG. 3C is a diagram illustrating a result of experiments for selecting a factor contributing to the removal of the titanium-containing material.
Figure 3D:
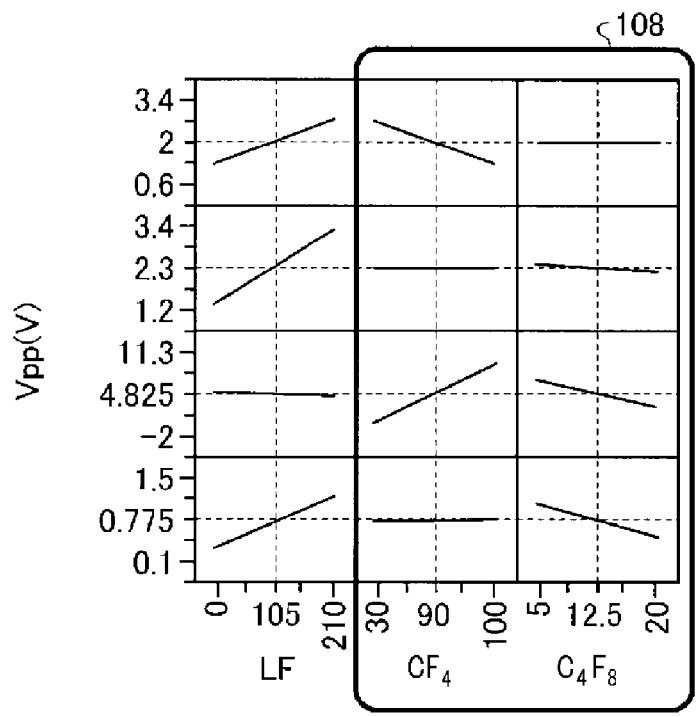
FIG. 3D is a diagram illustrating a result of experiments for selecting a factor contributing to the removal of the titanium-containing material.

FIG. 3A to FIG. 3D are diagrams each illustrating a result of experiments for selecting a factor contributing to removal of the titanium-containing material. Herein, there are provided results of experiments in which the wafer W, on which the TiN film as an example of the titanium-containing material deposited on the upper electrode 42 is formed, is etched while changing multiple parameters. A horizontal axis in FIG. 3A to FIG. 3D represents a value of each parameter contributing to the removal of the titanium-containing material in the experiment examples. Further, a vertical axis in FIG. 3A and FIG. 3C represents Vpp (V) of the wafer W when the high frequency power HF is outputted from the first high frequency power supply 30. Furthermore, a vertical axis in FIG. 3B and FIG. 3D represents Vpp (V) of the wafer W when the high frequency power LF is outputted from the second high frequency power supply 40. Herein, the Vpp denotes a difference between the maximum value and the minimum value of a voltage in the high frequency power on the surface of the wafer W. It can be seen that the Vpp correlates with plasma density caused by the high frequency power, and it can be found out that the variation in Vpp (V) corresponds to the variation in the plasma density.

As shown in a frame 102 of FIG. 3A and a frame 104 of FIG. 3B, a gradient of the Vpp in the case of changing a flow rate of a $N_2$ gas to be supplied into the plasma processing space is higher than a gradient of the Vpp in the case of changing the other parameters. It is assumed that this is because plasma of the $N_2$ gas contributes to the removal of the TiN film formed on the wafer W.

Meanwhile, as shown in a frame 106 of FIG. 3C and a frame 108 of FIG. 3D, a gradient of the Vpp in the case of changing a flow rate of a $CF_4$ gas or a $C_4F_8$ gas to be supplied into the plasma processing space is higher than a gradient of the Vpp in the case of changing the other parameters. It is assumed that this is because plasma of the $CF_4$ gas or the $C_4F_8$ gas contributes to the removal of the TiN film formed on the wafer W. From the results of the experiments, a nitrogen-containing gas such as a $N_2$ gas and a fluorine-containing gas such as a $CF_4$ gas or a $C_4F_8$ gas are selected as a factor most contributing to the removal of the titanium-containing material.

Figure 4:
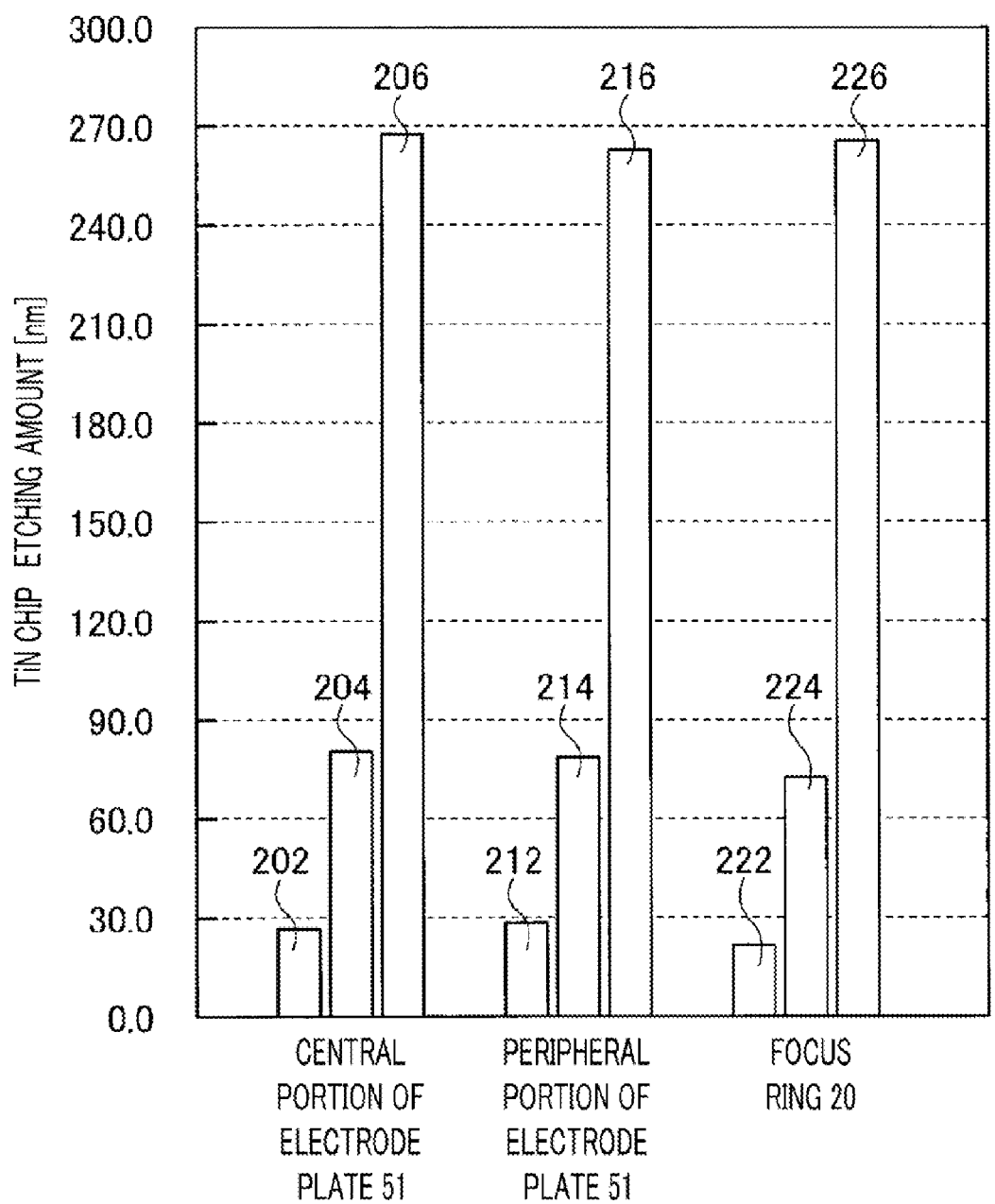
FIG. 4 is a diagram illustrating etching amounts of titanium-containing materials attached to members of which surfaces are arranged to face a plasma processing space.

Hereinafter, there will be explained an amount of etching, with plasma of the nitrogen-containing gas or the fluorine-containing gas, the titanium-containing material for each member in the case of etching the titanium-containing material deposited to the member, of which the surface is arranged to face the plasma processing space S, after performing the etching process on the wafer W. FIG. 4 is a diagram illustrating an etching amount of the titanium-containing material for each member of which the surface is arranged to face the plasma processing space. Herein, there is shown a measurement result in which a rectangular TiN chip (20 mm×20 mm) corresponding to the titanium-containing material deposited on a member, of which the surface is arranged to face the plasma processing space S, after performing the etching process on the wafer W is arranged on each member and the etching amount thereof is measured. A vertical axis of FIG. 4 represents the etching amount [nm] of the TiN chip. Further, a horizontal axis of FIG. 4 represents a position of the TiN chip arranged on each member.

A graph 202 of FIG. 4 shows the etching amount of the TiN chip arranged on a central portion of the electrode plate 51 (hereinafter, referred to as "electrode plate central chip") when the electrode plate central chip is etched with plasma of an $O_2$ gas. Further, a graph 204 shows the etching amount of the electrode plate central chip when the electrode plate central chip is etched with plasma of a $CHF_3$ gas after etching the chip with the plasma of the $O_2$ gas. Furthermore, a graph 206 shows the etching amount of the electrode plate central chip when the electrode plate central chip is etched with plasma of a $N_2$ gas and a $C_4F_8$ gas after etching the chip with the plasma of the $CHF_3$ gas.

Further, in FIG. 4, a graph 212 shows the etching amount of the TiN chip arranged on a peripheral portion of the electrode plate 51 (hereinafter, referred to as "electrode plate peripheral chip") when the electrode plate peripheral chip is etched with plasma of an $O_2$ gas. Further, a graph 214 shows the etching amount of the electrode plate peripheral chip when the electrode plate peripheral chip is etched with plasma of a $CHF_3$ gas after etching the chip with the plasma of the $O_2$ gas. Furthermore, a graph 216 shows the etching amount of the electrode plate peripheral chip when the electrode plate peripheral chip is etched with plasma of a $N_2$ gas and a $C_4F_8$ gas after etching the chip with the plasma of the $CHF_3$ gas.

Furthermore, in FIG. 4, a graph 222 shows the etching amount of the TiN chip arranged on the focus ring 20 (hereinafter, referred to as "focus ring chip") when the focus ring chip is etched with plasma of an $O_2$ gas. Further, a graph 224 shows the etching amount of the focus ring chip when the focus ring chip is etched with plasma of a $CHF_3$ gas after etching the chip with the plasma of the $O_2$ gas. Furthermore, a graph 226 shows the etching amount of the focus ring chip when the focus ring chip is etched with plasma of a $N_2$ gas and a $C_4F_8$ gas after etching the chip with the plasma of the $CHF_3$ gas.

Through the comparison between the graph 202 and the graphs 204 and 206, when the electrode plate central chip is etched with the plasma of the $N_2$ gas and the $C_4F_8$ gas, the etching amount of the electrode plate central chip is the highest. Further, through the comparison between the graph 212 and the graphs 214 and 216, when the electrode plate peripheral chip is etched with the plasma of the $N_2$ gas and the $C_4F_8$ gas as shown in the graph 216, the etching amount of the electrode plate peripheral chip is the highest. Furthermore, through the comparison between the graph 222 and the graphs 224 and 226, when the focus ring chip is etched with the plasma of the $N_2$ gas and the $C_4F_8$ gas, the etching amount of the focus ring chip is the highest. It is assumed that this is because the titanium-containing material deposited on the electrode plate 51 or the focus ring 20 chemically reacts with the plasma of the $N_2$ gas and the $C_4F_8$ gas to generate a complex gas such as $Ti(NF_3)$, so that the titanium-containing material deposited on the electrode plate 51 or the focus ring 20 can be removed.

Figure 5A:
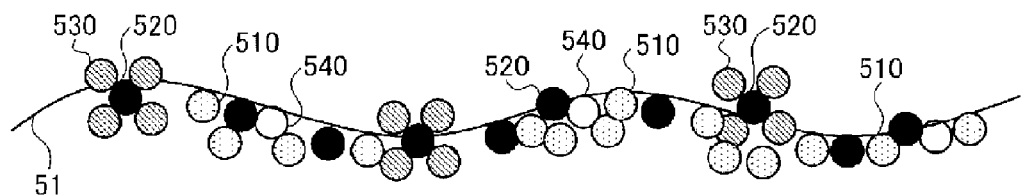
FIG. 5A is a diagram illustrating a plasma process model in accordance with the present example embodiment.
Figure 5B:
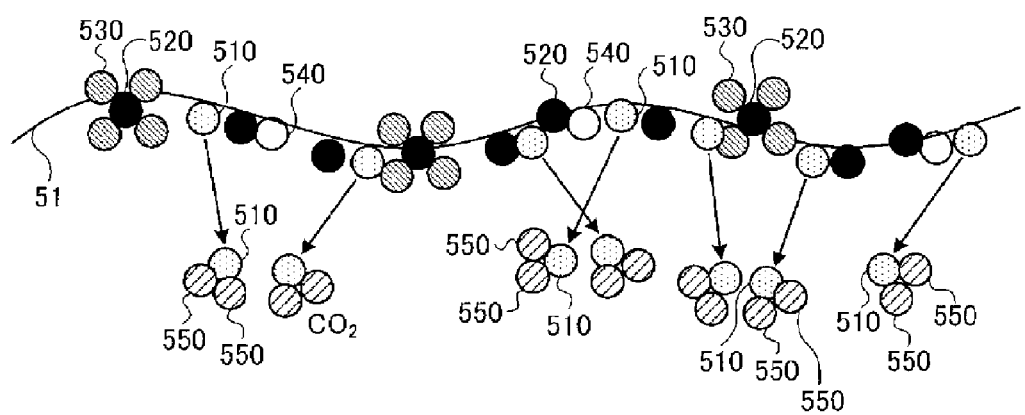
FIG. 5B is a diagram illustrating a plasma process model in accordance with the present example embodiment.
Figure 5C:
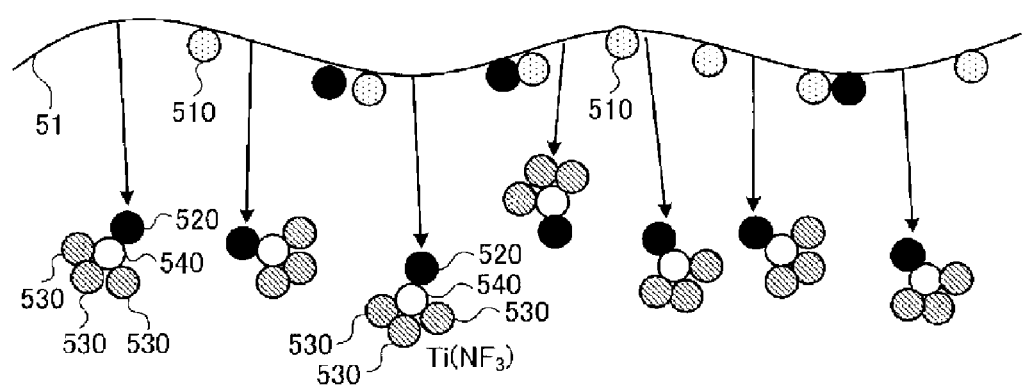
FIG. 5C is a diagram illustrating a plasma process model in accordance with the present example embodiment.

Further, a plasma process model in the present example embodiment will be explained. FIG. 5A to FIG. 5C are diagrams each illustrating a plasma process model in accordance with the present example embodiment. In FIG. 5A to FIG. 5C, a molecular model group 510 is a carbon model contained in the carbon-containing material deposited on the electrode plate 51 after performing the etching process on the wafer W. Further, in FIG. 5A to FIG. 5C, a molecular model group 520 is a titanium model contained in the titanium-containing material (e.g., $TiF_4$, TiN, $TiO_2$, Ti, and the like) deposited on the electrode plate 51 after performing the etching process on the wafer W. Furthermore, in FIG. 5A to FIG. 5C, a molecular model group 530 is a fluorine model contained in the titanium-containing material (e.g., $TiF_4$ and the like) deposited on the electrode plate 51 after performing the etching process on the wafer W. Moreover, in FIG. 5A to FIG. 5C, a molecular model group 540 is a nitrogen model contained in the titanium-containing material (e.g., TiN and the like) deposited on the electrode plate 51 after performing the etching process on the wafer W. Further, in FIG. 5B, a molecular model group 550 is an oxygen model.

In the plasma process of the present example embodiment, a first process of supplying the first fluorine-containing gas (e.g., $C_4F_8$ gas) into the plasma processing space S and etching the wafer W with plasma of the first fluorine-containing gas is performed. Thus, as depicted in FIG. 5A, on the surface of the electrode plate 51, the carbon-containing material (molecular model group 510) generated from the etched insulating film on the wafer W is deposited and the titanium-containing materials (the molecular model group 520, the molecular model group 530, and the molecular model group 540) generated from the etched mask film on the wafer W are also deposited. For this reason, the first process may be referred to as "etching process".

In the plasma process of the present example embodiment, a second process of supplying an $O_2$ gas into the plasma processing space S and removing, with plasma of the $O_2$ gas, the carbon-containing material deposited on the electrode plate 51 after performing the first process is performed. Thus, as depicted in FIG. 5B, the carbon-containing material on the surface of the electrode plate 51 chemically reacts with the plasma of the $O_2$ gas to generate CO or $CO_2$, so that the carbon-containing material is removed from the surface of the electrode plate 51. As a result, the titanium-containing materials on the surface of the electrode plate 51 are exposed. For this reason, the second process may be referred to as "carbon-containing material removal process".

In the plasma process of the present example embodiment, a third process of supplying the nitrogen-containing gas (e.g., $N_2$ gas or a $NF_3$ gas) and the second fluorine-containing gas (e.g., $CF_4$ gas, a $C_4F_8$ gas, or $CHF_3$ gas) into the plasma processing space S and removing, with plasma of the nitrogen-containing gas and the second fluorine-containing gas, the titanium-containing material deposited on the electrode plate 51 after performing the first process is performed. Thus, as depicted in FIG. 5C, the titanium-containing material on the surface of the electrode plate 51 chemically reacts with the plasma of the nitrogen-containing gas and the second fluorine-containing gas to generate a complex gas such as $Ti(NF_3)$, so that the titanium-containing material is removed from the surface of the electrode plate 51. For this reason, the third process may be referred to as "titanium-containing material removal process".

As described above, in the plasma process of the present example embodiment, the plasma processing apparatus 1 supplies the first fluorine-containing gas and etches the wafer W with the plasma of the first fluorine-containing gas in the first process. Further, in the plasma process of the present example embodiment, the plasma processing apparatus 1 supplies the $O_2$ gas into the plasma processing space S and removes, with the plasma of the $O_2$ gas, the carbon-containing material deposited on the electrode plate 51 after the first process in the second process, so that the titanium-containing material on the surface of the electrode plate 51 is exposed. Furthermore, in the plasma process of the present example embodiment, the plasma processing apparatus 1 supplies the nitrogen-containing gas and the second fluorine-containing gas into the plasma processing space S and removes, with the plasma of the nitrogen-containing gas and the second fluorine-containing gas, the titanium-containing material deposited on the electrode plate 51 after the first process in the third process, so that the complex gas such as $Ti(NF_3)$ is generated. For this reason, in accordance with the present example embodiment, even if deposits such as titanium-containing materials generated from the wafer W during the etching process are deposited on various members facing the plasma processing space, it is possible to effectively remove the deposits from the members. Therefore, it is possible to suppress the variation in the plasma density within the plasma processing space. As a result, in accordance with the present example embodiment, it is possible to suppress the etching characteristics of the wafer W from being degraded with a lapse of time.

Figure 6:
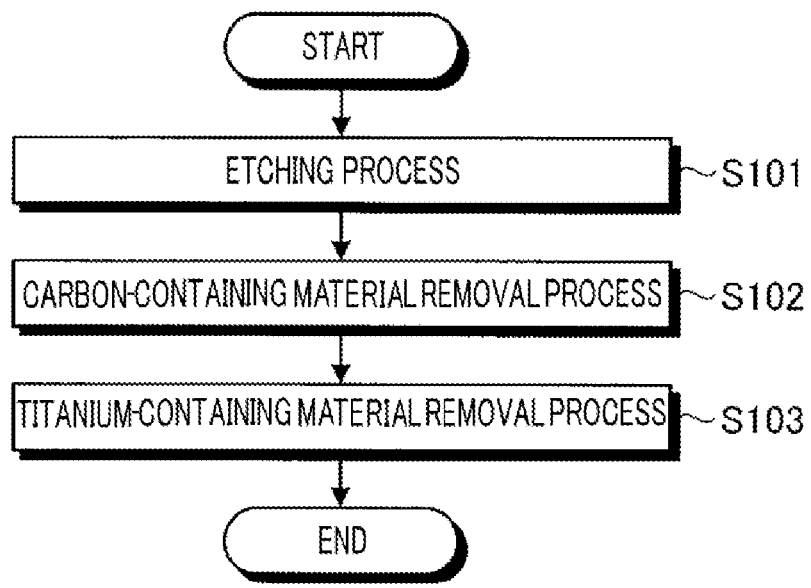
FIG. 6 is a flow chart of a plasma process in accordance with a first experimental example.

Hereinafter, example embodiments of the plasma process will be explained. FIG. 6 is a flow chart of a plasma process in accordance with a first experimental example.

In the plasma process in accordance with the first experimental example, the etching process is performed (process S101). To be specific, the control unit 150 controls the flow rate controller 74a to supply the first fluorine-containing gas into the plasma processing space S. Then, the control unit 150 controls the first high frequency power supply 30 and the second high frequency power supply 40 to excite the first fluorine-containing gas into plasma to etch the wafer W with the plasma of the first fluorine-containing gas.

Then, in the plasma process in accordance with the first experimental example, the carbon-containing material removal process is performed (process S102). To be specific, the control unit 150 controls the flow rate controller 74b to supply the $O_2$ gas into the plasma processing space S. Then, the control unit 150 controls the first high frequency power supply 30 and the second high frequency power supply 40 to excite the $O_2$ gas into plasma and removes, with the plasma of the $O_2$ gas, the carbon-containing material deposited on the electrode plate 51, of which the surface is arranged to face the plasma processing space S.

Thereafter, in the plasma process in accordance with the first experimental example, the titanium-containing material removal process is performed (process S103). To be specific, the control unit 150 controls the flow rate controller 74c and the flow rate controller 74d to supply the nitrogen-containing gas and the second fluorine-containing gas, respectively, into the plasma processing space S. Then, the control unit 150 controls the first high frequency power supply 30 and the second high frequency power supply 40 to excite the nitrogen-containing gas and the second fluorine-containing gas into plasma and removes, with the plasma of the nitrogen-containing gas and the second fluorine-containing gas, the titanium-containing material deposited on the electrode plate 51, of which the surface is arranged to face the plasma processing space S.

In the plasma process in accordance with the first experimental example, the wafer W is etched through the etching process, and the carbon-containing material deposited on the electrode plate 51 is removed through the carbon-containing material removal process, so that the titanium-containing material is exposed. Then, the titanium-containing material as a complex gas, e.g., $Ti(NF_3)$ is removed through the titanium-containing material removal process. For this reason, even if deposits such as the titanium-containing material generated from the wafer W during the etching process are deposited on the electrode plate 51, it is possible to remove the titanium-containing material of the deposits with high efficiency. Therefore, it is possible to suppress the variation in the plasma density within the plasma processing space. As a result, it is possible to suppress the etching characteristics of the wafer W from being degraded with a lapse of time.

Figure 7:
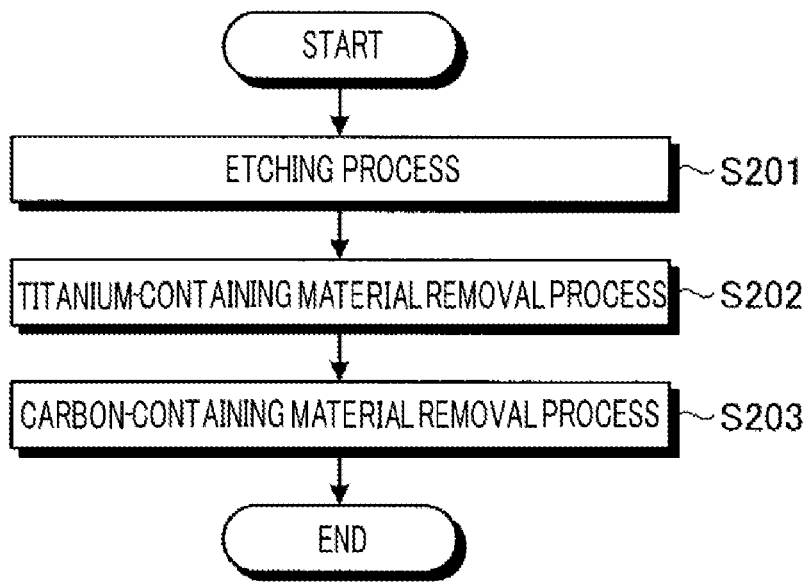
FIG. 7 is a flow chart of a plasma process in accordance with a second experimental example.

Hereinafter, a second experimental example of the plasma process will be explained. FIG. 7 is a flow chart of a plasma process in accordance with the second experimental example.

In the plasma process in accordance with the second experimental example, the etching process is performed (process S201). To be specific, the control unit 150 controls the flow rate controller 74a to supply the first fluorine-containing gas into the plasma processing space S. Then, the control unit 150 controls the first high frequency power supply 30 and the second high frequency power supply 40 to excite the first fluorine-containing gas into plasma to etch the wafer W with the plasma of the first fluorine-containing gas.

Then, in the plasma process in accordance with the second experimental example, the titanium-containing material removal process is performed (process S202). To be specific, the control unit 150 controls the flow rate controller 74c and the flow rate controller 74d to supply the nitrogen-containing gas and the second fluorine-containing gas, respectively, into the plasma processing space S. Then, the control unit 150 controls the first high frequency power supply 30 and the second high frequency power supply 40 to excite the nitrogen-containing gas and the second fluorine-containing gas into plasma and removes, with the plasma of the nitrogen-containing gas and the second fluorine-containing gas, the titanium-containing material deposited on the electrode plate 51, of which the surface is arranged to face the plasma processing space S.

Thereafter, in the plasma process in accordance with the second experimental example, the carbon-containing material removal process is performed (process S203). To be specific, the control unit 150 controls the flow rate controller 74b to supply the $O_2$ gas into the plasma processing space S. Then, the control unit 150 controls the first high frequency power supply 30 and the second high frequency power supply 40 to excite the $O_2$ gas into plasma and removes, with the plasma of the $O_2$ gas, the carbon-containing material deposited on the electrode plate 51, of which the surface is arranged to face the plasma processing space S.

In the plasma process in accordance with the second experimental example, the wafer W is etched through the etching process, and the titanium-containing material deposited on the electrode plate 51 as a complex gas, e.g., $Ti(NF_3)$ is removed through the titanium-containing material removal process, so that the carbon-containing material is exposed. Then, the carbon-containing material is removed through the carbon-containing material removal process. For this reason, even if deposits such as a titanium-containing material generated from the wafer W during the etching process are deposited on the electrode plate 51, it is possible to remove the titanium-containing material of the deposits with high efficiency. Therefore, it is possible to suppress the variation in the plasma density within the plasma processing space. As a result, it is possible to suppress the etching characteristics of the wafer W from being degraded with a lapse of time.

Figure 8:
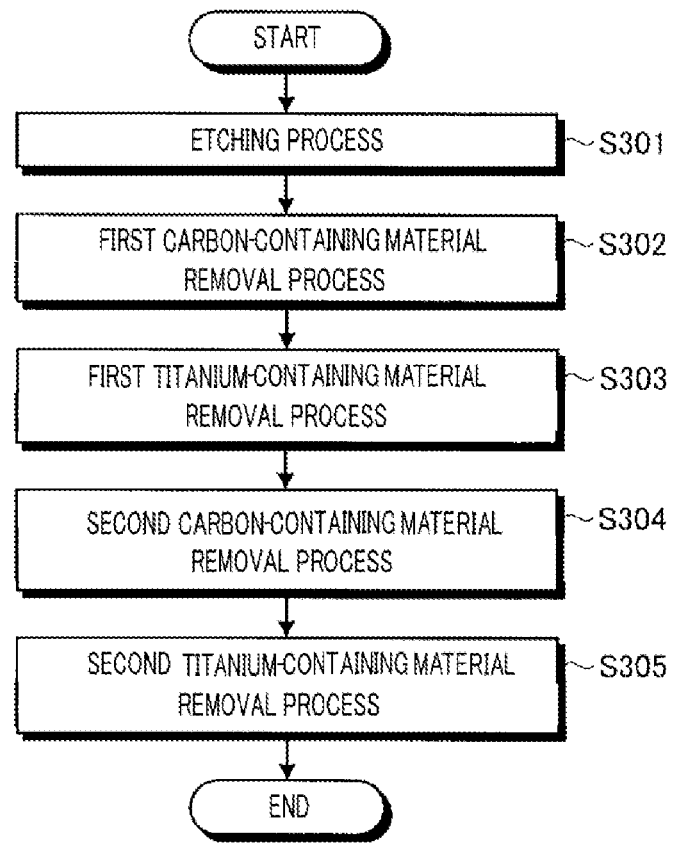
FIG. 8 is a flow chart of a plasma process in accordance with a third experimental example.

Hereinafter, a third experimental example of the plasma process will be explained. FIG. 8 is a flow chart of a plasma process in accordance with the third experimental example.

In the plasma process in accordance with the third experimental example, the etching process is performed (process S301). To be specific, the control unit 150 controls the flow rate controller 74a to supply the first fluorine-containing gas into the plasma processing space S. Then, the control unit 150 controls the first high frequency power supply 30 and the second high frequency power supply 40 to excite the first fluorine-containing gas into plasma to etch the wafer W with the plasma of the first fluorine-containing gas.

Then, in the plasma process in accordance with the third experimental example, a first carbon-containing material removal process is performed (process S302). To be specific, the control unit 150 controls the flow rate controller 74b to supply the $O_2$ gas into the plasma processing space S. Then, the control unit 150 controls the first high frequency power supply 30 and the second high frequency power supply 40 to excite the $O_2$ gas into plasma and removes, with the plasma of the $O_2$ gas, the carbon-containing material deposited on the electrode plate 51, of which the surface is arranged to face the plasma processing space S.

Thereafter, in the plasma process in accordance with the third experimental example, a first titanium-containing material removal process is performed (process S303). To be specific, the control unit 150 controls the flow rate controller 74c and the flow rate controller 74d to supply the nitrogen-containing gas and the second fluorine-containing gas, respectively, into the plasma processing space S. Then, the control unit 150 controls the first high frequency power supply 30 and the second high frequency power supply 40 to excite the nitrogen-containing gas and the second fluorine-containing gas into plasma and removes, with the plasma of the nitrogen-containing gas and the second fluorine-containing gas, the titanium-containing material deposited on the electrode plate 51, of which the surface is arranged to face the plasma processing space S.

Then, in the plasma process in accordance with the third experimental example, a second carbon-containing material removal process is performed (process S304). To be specific, the control unit 150 controls the flow rate controller 74b to supply the $O_2$ gas into the plasma processing space S. Then, the control unit 150 controls the first high frequency power supply 30 and the second high frequency power supply 40 to excite the $O_2$ gas into plasma and removes, with the plasma of the $O_2$ gas, the carbon-containing material deposited on the electrode plate 51, of which the surface is arranged to face the plasma processing space S.

Thereafter, in the plasma process in accordance with the third experimental example, a second titanium-containing material removal process is performed (process S305). To be specific, the control unit 150 controls the flow rate controller 74c and the flow rate controller 74d to supply the nitrogen-containing gas and the second fluorine-containing gas, respectively, into the plasma processing space S. Then, the control unit 150 controls the first high frequency power supply 30 and the second high frequency power supply 40 to excite the nitrogen-containing gas and the second fluorine-containing gas into plasma and removes, with the plasma of the nitrogen-containing gas and the second fluorine-containing gas, the titanium-containing material deposited on the electrode plate 51, of which the surface is arranged to face the plasma processing space S.

In the plasma process in accordance with the third experimental example, in the same manner as the first experimental example, the wafer W is etched through the etching process, the carbon-containing material deposited on the electrode plate 51 is removed through the carbon-containing material removal process, so that the titanium-containing material is exposed. Then, the titanium-containing material as a complex gas, e.g., $Ti(NF_3)$ is removed through the titanium-containing material removal process. For this reason, even if deposits such as a titanium-containing material generated from the wafer W during the etching process are deposited on the electrode plate 51, it is possible to remove the titanium-containing material of the deposits with high efficiency. Therefore, it is possible to suppress the variation in the plasma density within the plasma processing space. As a result, it is possible to suppress the etching characteristics of the wafer W from being degraded with a lapse of time. Further, in the plasma process in accordance with the third experimental example, after the etching process, a set of the carbon-containing material removal process and the titanium-containing material removal process is repeatedly performed twice. As a result, it is possible to remove the deposits deposited on the electrode plate 51 with higher efficiency. Although the third experimental example shows an example where the set of the carbon-containing material removal process and the titanium-containing material removal process is repeatedly performed twice after the etching process, the set of the carbon-containing material removal process and the titanium-containing material removal process may be repeatedly performed twice or more times after the etching process.

Figure 9:
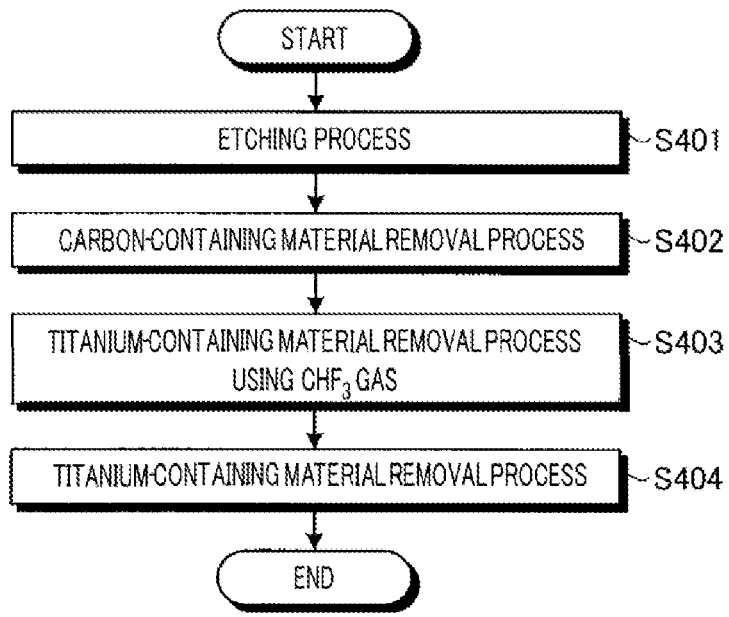
FIG. 9 is a flow chart of a plasma process in accordance with a fourth experimental example.

Hereinafter, a fourth experimental example of the plasma process will be explained. FIG. 9 is a flow chart of a plasma process in accordance with a fourth experimental example.

In the plasma process in accordance with the fourth experimental example, the etching process is performed (process S401). To be specific, the control unit 150 controls the flow rate controller 74a to supply the first fluorine-containing gas into the plasma processing space S. Then, the control unit 150 controls the first high frequency power supply 30 and the second high frequency power supply 40 to excite the first fluorine-containing gas into plasma to etch the wafer W with the plasma of the first fluorine-containing gas.

Then, in the plasma process in accordance with the fourth experimental example, the carbon-containing material removal process is performed (process S402). To be specific, the control unit 150 controls the flow rate controller 74b to supply the $O_2$ gas into the plasma processing space S. Then, the control unit 150 controls the first high frequency power supply 30 and the second high frequency power supply 40 to excite the $O_2$ gas into plasma and removes, with the plasma of the $O_2$ gas, the carbon-containing material deposited on the electrode plate 51, of which the surface is arranged to face the plasma processing space S.

Thereafter, in the plasma process in accordance with the fourth experimental example, a titanium-containing material removal process using a $CHF_3$ gas is performed (process S403). To be specific, the control unit 150 controls the flow rate controller 74d or the like to supply a $CHF_3$ gas as a third fluorine-containing gas into the plasma processing space S. Then, the control unit 150 controls the first high frequency power supply 30 and the second high frequency power supply 40 to excite the $CHF_3$ gas into plasma and removes, with the plasma of the $CHF_3$ gas, the titanium-containing material deposited on the electrode plate 51, of which the surface is arranged to face the plasma processing space S.

Then, in the plasma process in accordance with the fourth experimental example, the titanium-containing material removal process is performed (process S404). To be specific, the control unit 150 controls the flow rate controller 74c and the flow rate controller 74d to supply the nitrogen-containing gas and the second fluorine-containing gas, respectively, into the plasma processing space S. Then, the control unit 150 controls the first high frequency power supply 30 and the second high frequency power supply 40 to excite the nitrogen-containing gas and the second fluorine-containing gas into plasma and removes, with the plasma of the nitrogen-containing gas and the second fluorine-containing gas, the titanium-containing material deposited on the electrode plate 51, of which the surface is arranged to face the plasma processing space S.

In the plasma process in accordance with the fourth experimental example, in the same manner as the first experimental example, the wafer W is etched through the etching process, and the carbon-containing material deposited on the electrode plate 51 is removed through the carbon-containing material removal process, so that the titanium-containing material is exposed. Then, the titanium-containing material as a complex gas, e.g., $Ti(NF_3)$ is removed through the titanium-containing material removal process. For this reason, even if deposits such as a titanium-containing material generated from the wafer W during the etching process are deposited on the electrode plate 51, it is possible to remove the titanium-containing material of the deposits with high efficiency. Therefore, it is possible to suppress the variation in the plasma density within the plasma processing space. As a result, it is possible to suppress the etching characteristics of the wafer W from being degraded with a lapse of time. Further, in the plasma process in accordance with the fourth experimental example, between the carbon-containing material removal process and the titanium-containing material removal process, the $CHF_3$ gas as the third fluorine-containing gas is supplied into the plasma processing space to remove the titanium-containing material deposited on the electrode plate 51 with the plasma of the $CHF_3$ gas. As a result, it is possible to remove the deposits deposited on the electrode plate 51 with higher efficiency.

Figure 10A:
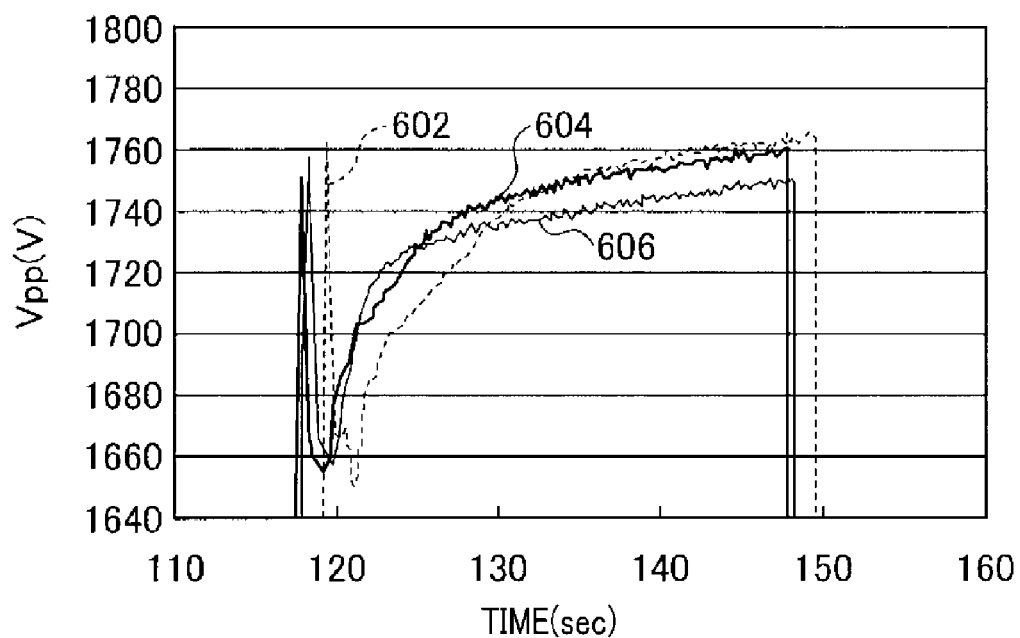
FIG. 10A is a diagram for explaining an effect of a plasma processing method in accordance with the present example embodiment.
Figure 10B:
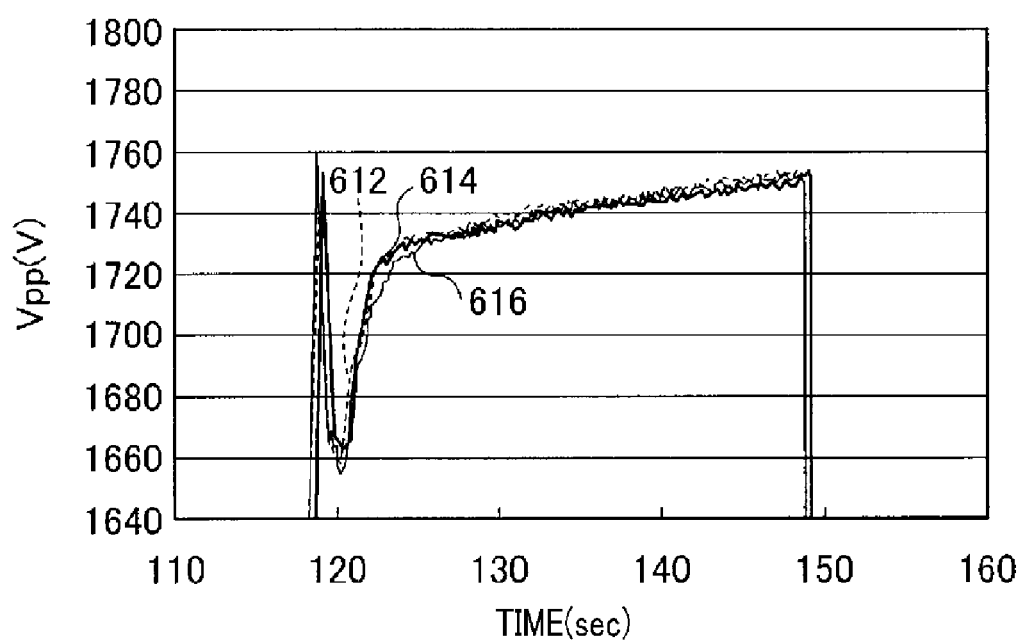
FIG. 10B is a diagram for explaining an effect of the plasma processing method in accordance with the present example embodiment.

Hereinafter, an effect of the plasma processing method in accordance with the present example embodiment will be explained. FIG. 10A and FIG. 10B are diagrams for explaining an effect of the plasma processing method in accordance with the present example embodiment. FIG. 10A and FIG. 10B are diagrams each showing an effect when a plasma process is performed on the wafer W in the plasma processing apparatus 1. In FIG. 10A and FIG. 10B, a horizontal axis represents a time (sec) during which the plasma process is performed on the wafer W in the plasma processing apparatus 1, and a vertical axis represents the Vpp (V) on the wafer W. Further, the Vpp denotes a difference between the maximum value and the minimum value of a voltage in the high frequency power on the surface of the wafer W. It can be seen that the Vpp correlates with the plasma density caused by the high frequency power, and it can be found out that the variation in the Vpp (V) corresponds to the variation in the plasma density.

Further, FIG. 10A is a graph showing a relationship between the Vpp on the wafer W for lot numbers during a dry cleaning (DC) process and the processing time in the case of performing the DC process on the wafer W with the plasma of the $O_2$ gas without using the plasma processing method in accordance with the present example embodiment. That is, a graph 602 in FIG. 10A shows a relationship between the Vpp and the processing time when the etching process is performed on a groove for dual damascene wiring with respect to 25 wafers W in lot number "1" (see FIG. 2) and then, the DC process is performed. A graph 604 shows a relationship between the Vpp and the processing time in the DC process after processing 25 wafers W in lot number "2" (i.e., after accumulatively processing 50 wafers W including lot number "1"). Further, a graph 606 shows a relationship between the Vpp and the processing time in the DC process after processing 25 wafers W in lot number "3" (i.e., after accumulatively processing 75 wafers W including lot numbers "1" and "2"). Further, FIG. 10B is a graph showing a relationship between the Vpp on the wafer W for lot numbers and the processing time in the case of performing the plasma process on the wafer W using the plasma processing method in accordance with the present example embodiment. That is, a graph 612 in FIG. 10B shows a relationship between the Vpp and the processing time when the etching process is performed on a groove for dual damascene wiring with respect to 25 wafers W in lot number "1" (see FIG. 2) and the plasma process in accordance with the present example embodiment is performed and then, the DC process is performed. In other words, the graph 612 shows an effect in the case of performing the plasma process in accordance with the present example embodiment before the DC process of FIG. 10A. A graph 614 shows a relationship between the Vpp and the processing time in the DC process after processing 25 wafers W in lot number "2" (i.e., accumulatively processing 50 wafers W including lot number "1") and the plasma process in accordance with the present example embodiment. A graph 616 shows a relationship between the Vpp and the processing time in the DC process after processing 25 wafers W in lot number "3" (i.e., after accumulatively processing 75 wafers W including lot numbers "1" and "2") and the plasma process in accordance with the present example embodiment.

As shown in FIG. 10A, if only the DC process is performed without using the plasma processing method in accordance with the present example embodiment, the variations of the Vpp on the wafer W with respect to the processing time are different according to a difference in a lot number as shown in the graphs 602, 604, and 606. It is assumed that this is because the titanium-containing material generated from the mask film on the wafer W during the etching process is accumulatively deposited on the electrode plate 51 facing the plasma processing space and the plasma density within the plasma processing space is varied.

Meanwhile, in the case of performing the plasma process on the wafer W using the plasma processing method in accordance with the present example embodiment, the carbon-containing material deposited on the electrode plate 51 is removed through the carbon-containing material removal process and the titanium-containing material deposited on the electrode plate 51 is removed through the titanium-containing material removal process. As a result, as shown in the graphs 612, 614, and 616 of FIG. 10B during the DC process, the variations of the Vpp on the wafer W with respect to the processing time are equivalently maintained regardless of the lot number. It is assumed that this is because even when the titanium-containing material generated from the mask film on the wafer W during the etching process is accumulatively deposited on the electrode plate 51 facing the plasma processing space, the titanium-containing material deposited on the electrode plate 51 is removed. That is, it can be found out that the variation in the plasma density is suppressed.

Figure 11:
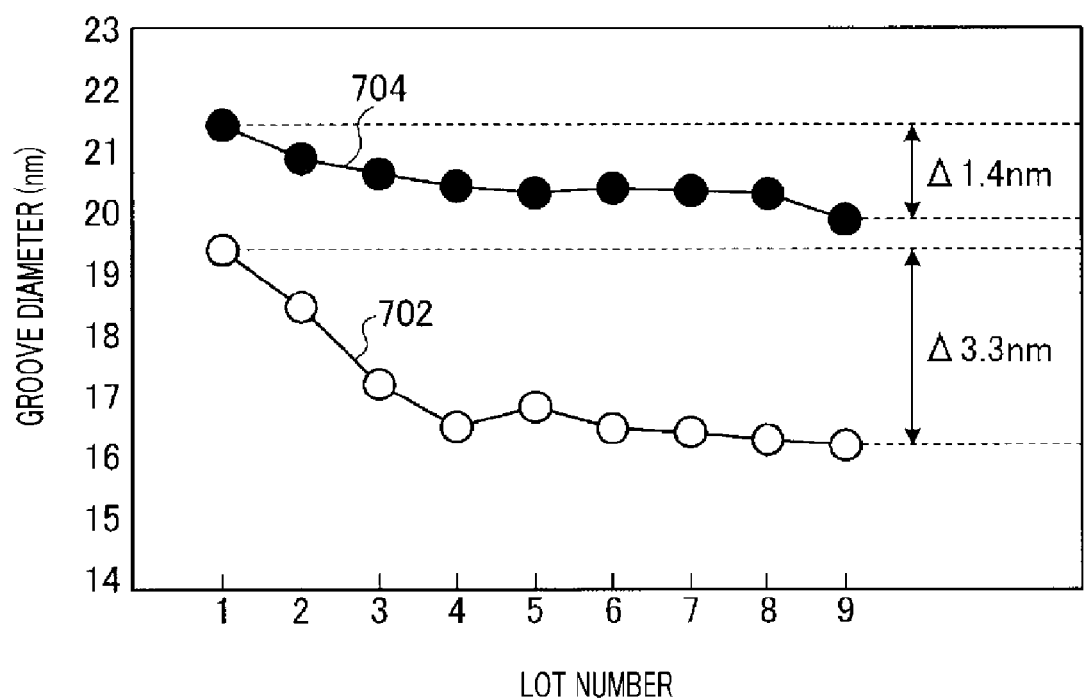
FIG. 11 is a diagram for explaining an effect of the plasma processing method in accordance with the present example embodiment.

FIG. 11 is a diagram for explaining an effect of the plasma processing method in accordance with the present example embodiment. A horizontal axis in FIG. 11 represents a lot number (cumulative value) of the wafers W loaded into the plasma processing apparatus 1, and a vertical axis represents a diameter (nm) of a groove formed on the insulating film when the insulating film on the wafer W is etched.

Further, in FIG. 11, a graph 702 shows changes in the diameter of the groove formed on the insulating film with respect to the lot number (cumulative value) in the case of performing the DC process only without using the plasma processing method in accordance with the present example embodiment. Further, in FIG. 11, a graph 704 shows changes in the diameter of the groove formed on the insulating film with respect to the lot number in the case of performing the plasma processing method in accordance with the present example embodiment.

Through the comparison between the graph 702 and the graph 704, the decrement in the diameter of the groove formed on the insulating film with respect to the lot number in the case of performing the plasma processing method in accordance with the present example embodiment is smaller than that in the case of performing the DC process only. It is assumed that this is because in the case of performing the plasma processing method in accordance with the present example embodiment, even when the titanium-containing material generated from the mask film of the wafer W during the etching process is deposited on the electrode plate 51 facing the plasma processing space, the titanium-containing material deposited on the electrode plate 51 is removed. As a result, it can be seen that the plasma density becomes stable and the change in the etched groove shape is suppressed accordingly.

EXPLANATION OF REFERENCE NUMERALS

1: Plasma processing apparatus
11: Processing vessel
20: Focus ring
30: First high frequency power supply
40: Second high frequency power supply
42: Upper electrode
51: Electrode plate
52: Electrode supporting body
72: Processing gas supply source
72a, 72b, 72c, 72d: Gas supply units
74a, 74b, 74c, 74d: Flow rate controllers
150: Control unit
D1: Insulating film
D2: Mask film
S: Plasma processing space
W: Wafer

I claim:

1. A plasma processing method for performing a plasma process on a target substrate having an insulating film and a mask film of a titanium-containing material in a plasma processing space, the plasma processing method comprising:
a first process of supplying a first fluorine-containing gas into the plasma processing space and etching the insulating film, with plasma of the first fluorine-containing gas and with the mask film of the titanium-containing material as a mask, so that a carbon-containing material generated from the insulating film and a titanium-containing material generated from the mask film are deposited on a member in the plasma processing space;
a second process of supplying an $O_2$ gas into the plasma processing space and removing, with plasma of the $O_2$ gas, the carbon-containing material to expose the titanium-containing material deposited on the member; and
a third process of supplying a nitrogen-containing gas and a second fluorine-containing gas into the plasma processing space and removing, with plasma of the nitrogen-containing gas and the second fluorine-containing gas, the exposed titanium-containing material deposited on the member, after the second process.

2. The plasma processing method of claim 1,
wherein the second process and the third process are repeatedly performed at least twice after performing the first process.

3. The plasma processing method of claim 1,
wherein the nitrogen-containing gas is at least one of a $N_2$ gas and a $NF_3$ gas, and the second fluorine-containing gas is at least one of a $CF_4$ gas, a $C_4F_8$ gas, and a $CHF_3$ gas.

4. A plasma processing method for performing a plasma process on a target substrate having an insulating film and a mask film of a titanium-containing material in a plasma processing space, the plasma processing method comprising:
a preparing process of preparing a target substrate in the plasma processing space;
a first process of supplying a first fluorine-containing gas into the plasma processing space and etching the insulating film, with plasma of the first fluorine-containing gas and with the mask film of the titanium-containing material as a mask, so that a carbon-containing material generated from the insulating film and a titanium-containing material generated from the mask film are deposited on a member in the plasma processing space;
a second process of supplying a nitrogen-containing gas and a second fluorine-containing gas into the plasma processing space and removing, with plasma of the nitrogen-containing gas and the second fluorine-containing gas, the titanium-containing material deposited on the member; and a third process of supplying an $O_2$ gas into the plasma processing space and removing, with plasma of the $O_2$ gas, the carbon-containing material, after the second process.

5. The plasma processing method of claim 4, wherein the titanium-containing material is TiN.

6. The plasma processing method of claim 4, wherein the second process and the third process are repeatedly performed at least twice.

7. The plasma processing method of claim 4, wherein the nitrogen-containing gas is at least one of a $N_2$ gas and a $NF_3$ gas, and the second fluorine-containing gas is at least one of a $CF_4$ gas, a $C_4F_8$ gas, and a $CHF_3$ gas.

8. The plasma processing method of claim 1, wherein the titanium-containing material is TiN.

9. A plasma processing method for performing a plasma process on a target substrate having an insulating film and a mask film of a titanium-containing material in a plasma processing space, the plasma processing method comprising:
a first process of supplying a first fluorine-containing gas into the plasma processing space and etching the insulating film, with plasma of the first fluorine-containing gas and with the mask film of the titanium-containing material as a mask, so that a carbon-containing material generated from the insulating film and a titanium-containing material generated from the mask film are deposited on a member in the plasma processing space;
a second process of supplying an $O_2$ gas into the plasma processing space and removing, with plasma of the $O_2$ gas, the carbon-containing material to expose the titanium-containing material deposited on the member, after the first process;
a third process of supplying a second fluorine-containing gas into the plasma processing space and removing, with plasma of the second fluorine-containing gas, the exposed titanium-containing material deposited on the member, after the second process; and
a fourth process of supplying a nitrogen-containing gas and a third fluorine-containing gas into the plasma processing space and removing, with plasma of the nitrogen-containing gas and the third fluorine-containing gas, the titanium-containing material deposited on the member, after the third process.

10. The plasma processing method of claim 9, wherein the titanium-containing material is TiN.

11. The plasma processing method of claim 9, wherein the nitrogen-containing gas is at least one of a $N_2$ gas and a $NF_3$ gas, and the second fluorine-containing gas and the third fluorine-containing gas are at least one of a $CF_4$ gas, a $C_4F_8$ gas, and a $CHF_3$ gas.

* * * * *

UNITED STATES PATENT AND TRADEMARK OFFICE
CERTIFICATE OF CORRECTION

| | | |
|---|---|---|
| PATENT NO. | : 9,460,896 B2 | Page 1 of 1 |
| APPLICATION NO. | : 14/424217 | |
| DATED | : October 4, 2016 | |
| INVENTOR(S) | : Akitoshi Harada | |

It is certified that error appears in the above-identified patent and that said Letters Patent is hereby corrected as shown below:

On the Title Page

In item (30) Foreign Application Priority Data, change the application number from "201-186344" to -- 2012-186344 --.

In the Specification

Column 3, Line 59, change "CF" to -- $CF_4$ --.

Signed and Sealed this
Seventeenth Day of January, 2017

Michelle K. Lee
*Director of the United States Patent and Trademark Office*